United States Patent [19]

Laupman

[11] 3,961,278
[45] June 1, 1976

[54] TRANSISTOR AMPLIFIER

[75] Inventor: Robert Ronald Laupman, Wijchen, Netherlands

[73] Assignee: Novanex Automation N.V., Wijchen, Netherlands

[22] Filed: Feb. 18, 1975

[21] Appl. No.: 550,434

Related U.S. Application Data

[63] Continuation of Ser. No. 372,998, June 25, 1973, abandoned.

[30] Foreign Application Priority Data

June 26, 1972 Netherlands...................... 7208762

[52] U.S. Cl.................................... 330/21; 330/31; 330/126
[51] Int. Cl.².......................................... H03F 3/04
[58] Field of Search........ 179/1 D, 1 VL, 100.1 TC; 325/424; 330/21, 31, 126

[56] References Cited
UNITED STATES PATENTS

| | | |
|---|---|---|
| 2,235,249 | 3/1941 | Baxter................................ 179/1 D |
| 3,210,681 | 10/1965 | Rhodes................................ 330/31 |

*Primary Examiner*—R. V. Rolinec
*Assistant Examiner*—Lawrence J. Dahl
*Attorney, Agent, or Firm*—Diller, Brown, Ramik & Wight

[57] ABSTRACT

A transistor amplifier comprising a first transistor having its base connected to the input terminal of the amplifier and having one of its further electrodes connected through a coupling capacitor to the output terminal of the amplifier. The transistor has the other one of its further electrodes connected to the base of a subsequent transistor having the corresponding electrode of its further electrodes connected through a second coupling capacitor to a second output terminal of the amplifier. The capacitance of the second coupling capacitor is higher than that of the first coupling capacitor.

8 Claims, 5 Drawing Figures

TRANSISTOR AMPLIFIER

This is a continuation, of application Ser. No. 372,998 filed Jun. 25, 1973, now abandoned.

The present invention relates to a transistor amplifier comprising a first transistor having its base connected to the input terminal of the amplifier and having one of its further electrodes connected through a coupling capacitor to the output terminal of the amplifier.

It is an object of the present invention to improve the freqency behaviour of the output signal in such a known type transistor amplifier.

To achieve this object, according to the present invention the transistor has the other one of its further electrodes connected to the base of a subsequent transistor having the corresponding electrode of its further electrodes connected through a second coupling capacitor to a second output terminal of the amplifier, the second coupling capacitor having a higher capacitance than the first coupling capacitor.

The present invention will be elucidated hereinafter with reference to the accompanying drawing, wherein.

Figure 1:
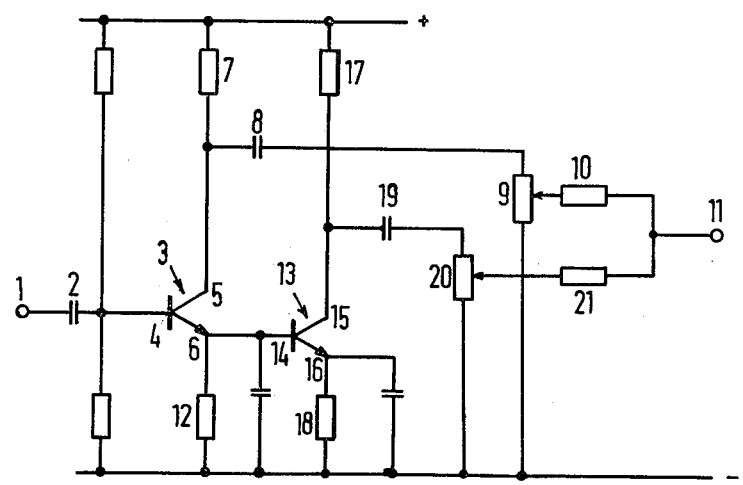
FIG. 1 shows an embodiment of a transistor amplifier according to the present invention.

In the embodiment shown in FIG. 1, the tramsistor amplifier comprises an input terminal 1 whereto the signal to be amplified is to be applied, which terminal 1 is connected through a coupling capacitor 2 to the base 4 of a transistor 3. The junction point of the coupling capacitor 2 and the base 4 is connected through two unidentified resistors to the positive and negative line, respectively, of the system. The collector 5 of the transistor 3 is connected through a resistor 7 to the positive line. The junction point of the collector 5 and the resistor 7 is connected through a coupling capacitor 8 to a voltage divider 9 having its other terminal connected to the negative line and having its slider contact connected through a resistor 10 to the output terminal 11 of the amplifier.

The emitter 6 of transistor 3 is connected through a resistor 12 to the negative line. An unidentified capacitor is connected in parallel to the resistor 12.

According to the present invention, the emitter 6 is also connected to the base 14 of a transistor 13 having its collector 15 connected through a resistor 17 to the positive line and having its emitter 16 connected through a resistor 18 to the negative line. An unidentified capacitor is connected in parallel to the resistor 18. The junction point of the collector 15 and the resistor 17 is connected through a coupling capacitor 19 having a higher capacitance than the coupling capacitor 8 to a voltage divider 20 having its other terminal connected to the negative line. The slider contact of the voltage divider 20 is connected through a resistor 21 to the output terminal 11.

In this circuit arrangement use is made of the fact that, when an input signal is applied to the input terminal 1, a weak signal will appear at the emitter 6 of transistor 3, which signal will comprise more low frequencies than the initial signal at input terminal 1. This weak signal is amplified by means of the transistor 13. Consequently, all the frequencies of the input signal will appear, as an adequate signal at the collector of transistor 3, and the low frequencies of the input signal will appear, as an adequate signal, at the collector of the transistor 13. When the coupling capacitor 8 is selected to have a low capacitance, only the high frequencies will be transmitted through this path, whereas as mentioned above only the low frequencies are transmitted through the path including the coupling capacitor 19. This makes it possible for the resultant signals occurring at the voltage dividers 9 and 20, respectively, to be separately processed, intensity-controlled, recombined to a channel having separated high-low frequency control, etc. Consequently, the present invention provides an amplifier with tone control which can be realized with simple means, and the result is at least as good as that of the corresponding known amplifiers, such as the so-called Baxandal tone control amplifier.

It will be clear that the sub-division of the frequency range may be extended by providing additional transistor stages.

Figure 2:
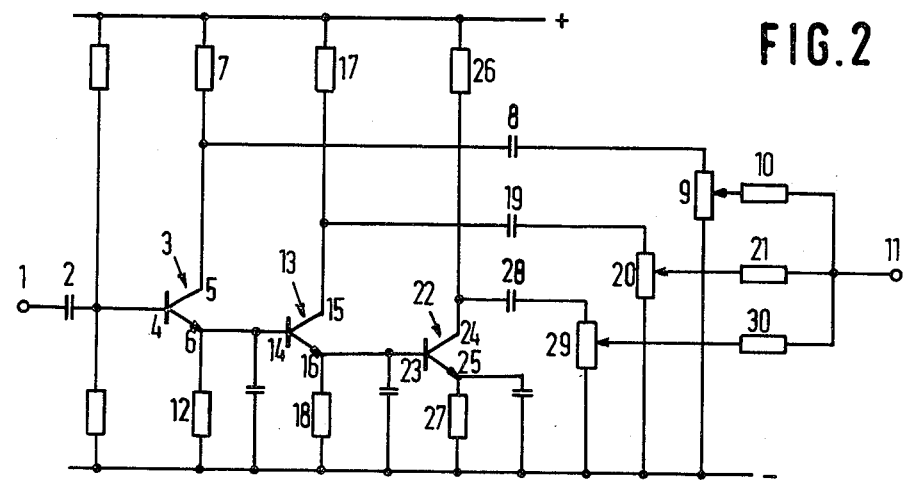
FIG. 2 shows an elaboration of the embodiment shown in FIG. 1.

FIG. 2 shows an embodiment according to the present invention wherein the emitter 16 of transistor 13 is connected to the base 23 of an additional transistor 22 having its collector 24 connected through a resistor 26 to the positive line and having its emitter 25 connected through a resistor 27 to the negative line. An unidentified capacitor is connected in parallel to the resistor 27. The junction point of the collector 24 and the resistor 26 is connected through a coupling capacitor 28 to a voltage divider 29 having its other terminal connected to the negative line. The slider contact of the voltage divider 29 is connected through a resistor 30 to the output terminal 11.

In view of the above it will be clear that the coupling capacitor 28 must have a higher capacitance than the coupling capacitor 19.

Figure 3:
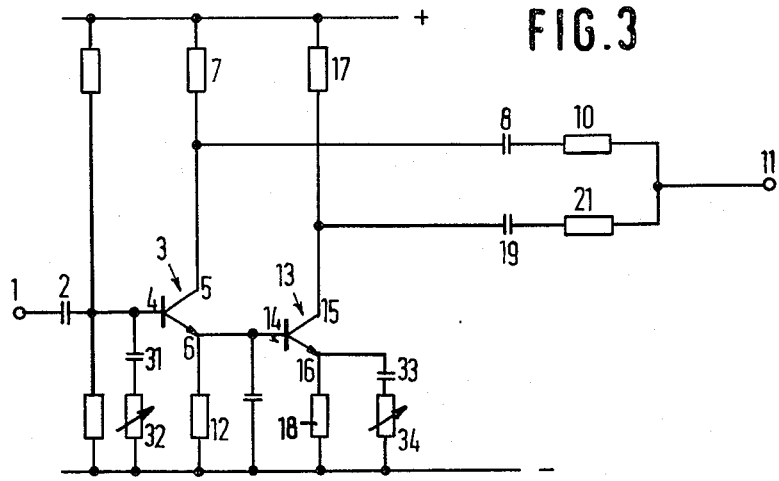
FIG. 3 shows a further embodiment according to the present invention, which is simplified with respect to that shown in FIG. 1.

FIG. 3 shows a further embodiment according to the present invention, which boils down to a simplification of the arrangement shown in FIG. 1. In this embodiment the input signal of the amplifier is directly controlled in so far as the high frequencies are concerned, while the low frequencies are controlled by a variable feedback of the emitter of the second transistor. In FIG. 3 the corresponding components are identified by the same reference numerals as in FIG. 1, Consequently, only the differences between the embodiments shown in FIG. 3 and FIG. 1 will be elucidated hereinafter.

The embodiment shown in FIG. 3 does not comprise the voltage dividers 9 and 20; the coupling capacitors are directly connected to the resistors 10 and 21, respectively. The base 4 of transistor 3 is connected through a series-connection of a capacitor 31 and a variable resistor 32 to the negative line. Furthermore, the emitter 6 of transistor 13 is connected through a similar series-connection of a capacitor 33 and a variable resistor 34 also the negative line. In view of the above observations as regards this embodiment, the operation thereof need not be elucidated.

Figure 4:
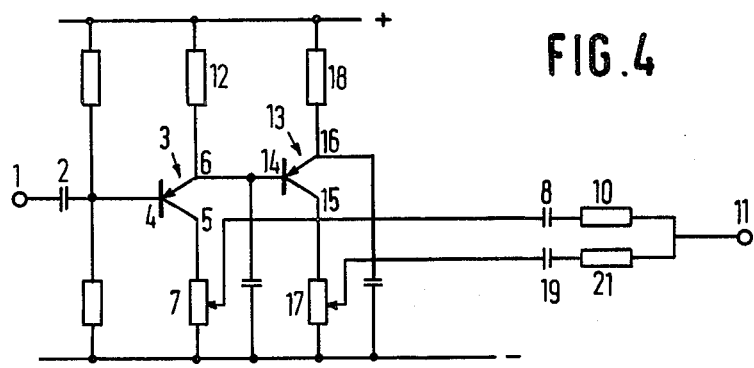
FIG. 4 shows yet a further embodiment according to the present invention, which actually is a reversal of the embodiment shown in FIG. 1 but wherein less components are required.

FIG. 4 shows an embodiment according to the present invention, which actually is a reversal of the embodiment shown in FIG. 1 but wherein less components are required than in the embodiment shown in FIG. 1. Also in this arrangement the same reference numerals are used as in FIG. 1, only the differences between the two embodiments will be set forth.

The emitters 6 and 16 of transistors 3 and 13, respectively, are connected through resistors 12 and 18, respectively, to the positive line. The collectors 5 and 15 of the respective transistors are connected through the resistors 7 and 17, respectively, which resistors function as voltage dividers, to the negative line. The slider contacts of the two voltage dividers are connected through coupling capacitors 8 and 19, respectively, and resistors 10 and 21, respectively, to the output terminal 11. This embodiment operates in the same manner as that shown in FIG. 1.

Figure 5:
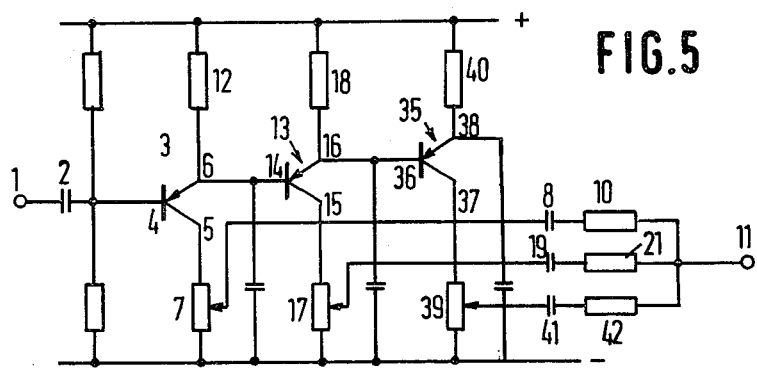
FIG. 5 shows an elaboration of the embodiment shown in FIG. 4 in the manner shown in FIG. 2 as regards the embodiment shown in FIG. 1.

FIG. 5 shows an embodiment which is an elaboration of that shown in FIG. 4 in the same manner as the embodiment shown in FIG. 2 is an elaboration of that shown in FIG. 1. The collector 16 of transistor 13 is connected to the base 36 of a transistor 35 having its emitter 38 connected through a resistor 40 to the positive line and having its collector 37 connected through a voltage divider 39 to the negative line. The slider contact of the voltage divider 39 is connected through a coupling capacitor 41 and a resistor 42 to output terminal 11.

The operation of this embodiment substantially corresponds with that of the embodiment shown in FIG. 2.

It is observed that the coupling capacitors 8, 19, 28 and 41 may be adjustable for adjusting the operating points of the different embodiments.

It will be clear, finally, that the elaborations shown in FIGS. 2 and 5 may be further extended by providing additional transistor stages.

It will be clear, finally, that the elaborations shown in FIGS. 2 and 5 may be further extended by providing additional transistor stages.

I claim:
1. A transistor amplifier system for amplifying and dividing a spectrum of frequencies contained in an input signal, comprising in combination:
a plurality of transistor amplifier stages connected in cascade, each stage including a transistor having a base electrode and an emitter-collector output path, there being at least two amplifier stages formed by a first and second transistor with the emitter-collector output path of said first transistor being connected to the base electrode of said second transistor; and
output means for providing the amplified and divided spectrum of frequencies, said output means including at least first and second coupling capacitors and an output terminal means;
said first transistor having its base electrode connected to receive the input signal to be amplified and having an emitter electrode and a collector electrode defining its emitter-collector output path;
said first coupling capacitor having a value to pass the higher frequency content of the amplified input signal and connected between one of said emitter and collector electrodes of said first transistor and said output terminal means;
said second transistor having its base electrode connected with that electrode of the emitter-collector output path of said first transistor which is not connected with said first coupling capacitor so as to be biased predominantly by lower frequencies of the input signal, and having an emitter electrode and a collector electrode defining its emitter-collector output path; and
said second coupling capacitor having a value to pass said lower frequencies of the amplified input signal and connected between one of said emitter and collector electrodes of said second transistor and said output terminal means.

2. A transistor amplifier system as defined in claim 1 including a third transistor amplifier stage comprising a third transistor having a base electrode, and emitter and collector electrodes defining an emitter-collector output path, and wherein said output means includes a third coupling capacitor, said third transistor having its base electrode connected with that electrode of the emitter-collector output path of said second transistor which is not connected to said second coupling capacitor, and said third coupling capacitor having a value to pass a frequency content lower in value than that frequency content passed by said second coupling capacitor and connected between one of said emitter and collector electrodes of said third transistor and said output terminal menas.

3. A transistor amplifier system as defined in claim 1 wherein said output terminal means includes a common output terminal and first and second voltage dividers connected respectively between said first and second coupling capacitors and said common output terminal.

4. A transistor amplifier system as defined in claim 1 including a capacitor and a variable resistor connected in series with each other and so connected to the base electrode of said first transistor as to be in parallel with said first transistor, and a capacitor and a variable resistor connected in series with each other and connected in series with one of the electrodes forming the emitter-collector path of said second transistor.

5. A transistor amplifier system as defined in claim 2 wherein said output terminal means includes a common output terminal and first, second and third voltage dividers connected respectively between said first, second and third coupling capacitors and said common output terminal.

6. A transistor amplifier system as defined in claim 2 including a capacitor and a variable resistor connected in series with each other and so connected to the base electrode of said first transistor as to be in parallel with said first transistor, and a capacitor and a variable resistor connected in series with each other and in series with that electrode in the emitter-collector output path of said third transistor to which said third coupling capacitor is not connected.

7. A transistor amplifier system as defined in claim 1 wherein the emitter-collector path of each of said transistors includes a voltage divider having a movable tap which is connected between the emitter-collector path and the coupling capacitor corresponding to said transistor.

8. A transistor amplifier system as defined in claim 2 wherein the emitter-collector path of each of said transistors includes a voltage divider having a movable tap which is connected between the emitter-collector path and the coupling capacitor corresponding to said transistor.

* * * * *